United States Patent
Lin et al.

(10) Patent No.: US 8,251,653 B2
(45) Date of Patent: Aug. 28, 2012

(54) HEAT DISSIPATION MODULE AND FASTENING STRUCTURE THEREOF

(75) Inventors: Yu-Hsien Lin, Taoyuan Hsien (TW); Kun-Yu Kuo, Taoyuan Hsien (TW); Yu-Hung Huang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 1020 days.

(21) Appl. No.: 12/210,074

(22) Filed: Sep. 12, 2008

(65) Prior Publication Data

US 2009/0145578 A1 Jun. 11, 2009

(30) Foreign Application Priority Data

Dec. 6, 2007 (TW) ................................ 96146459 A

(51) Int. Cl.
*F04D 29/60* (2006.01)
*F01D 25/26* (2006.01)
*H05K 7/20* (2006.01)
(52) U.S. Cl. ..................................... 415/213.1; 361/695
(58) Field of Classification Search ................ 415/213.1, 415/220; 416/244 R; 361/695
See application file for complete search history.

(56) References Cited

U.S. PATENT DOCUMENTS

| 6,711,015 | B2 * | 3/2004 | Syring et al. ................... 361/695 |
| 6,934,153 | B2 * | 8/2005 | Lee et al. ....................... 361/697 |
| 7,131,485 | B2 * | 11/2006 | Yu et al. ....................... 165/80.3 |
| 2007/0058341 | A1 * | 3/2007 | Hsiao .............................. 361/695 |
| 2007/0119567 | A1 * | 5/2007 | Yeh et al. ...................... 165/80.3 |
| 2007/0155301 | A1 * | 7/2007 | Chen et al. .................... 454/184 |
| 2012/0087790 | A1 * | 4/2012 | Zeng et al. ................. 415/213.1 |

FOREIGN PATENT DOCUMENTS

JP 09084290 A * 3/1997
JP 2007280281 A * 10/2007

* cited by examiner

*Primary Examiner* — Edward Look
*Assistant Examiner* — William Grigos
(74) *Attorney, Agent, or Firm* — Muncy, Geissler, Olds & Lowe, PLLC

(57) ABSTRACT

A heat dissipation module is disclosed, including a fan and a fastening structure. The fastening structure includes housing and at least one fixing element. The fixing element is disposed on the sidewall of the housing and has a first protruding part extruding from the inner side of the sidewall. When the fan is assembled with the fastening structure, the first protruding part partially enters into at least one molding hole of the frame of the fan and the first protruding part is placed against the edge of the molding hole.

16 Claims, 10 Drawing Sheets

HEAT DISSIPATION MODULE AND FASTENING STRUCTURE THEREOF

CROSS REFERENCE TO RELATED APPLICATIONS

This Non-provisional application claims priority under 35 U.S.C. §119(a) on Patent Application No(s). 096146459, filed in Taiwan, Republic of China on Dec. 6, 2007, the entire contents of which are hereby incorporated by reference.

BACKGROUND OF THE INVENTION

1. Field of the Invention

The present invention relates to a heat dissipation module and a fastening structure thereof, and more particularly to a heat dissipation module and a fastening structure thereof that can be fixed without a tool and assemble and disassemble easily and rapidly, and also make lower noise.

2. Description of the Related Art

As technology advances, electronic elements, such as a personal computer, a CPU or a GPU of a server, consumes more power and generates more heats because of high operating frequency. If heats generated by the electronic elements are not dissipated properly, efficiency of the electronic elements may be decreased, or the electronic elements may be burned out.

To solve the above-mentioned problem, a heat sink and a fan are installed on electronic elements producing high temperatures. Referring to FIG. 1, FIG. 1 is an exploded view of a conventional fan and housing. During the assembling process, the assembling holes (not shown) of the fan 11 and the housing 12a are arranged along an axle A. A plurality of screws 13 pass through the assembling holes along the axle A to tightly fix the fan 11 with the housing 12a. Thus, a screw driver and other hand tools are used to assemble and disassemble the screws 13, and the cost therefore increased. However, when assembling and disassembling the fan 11, the screws 13 may sometimes strip, so as to result in fixation failure or break of the housing 12a.

Alternatively, several hooks are disposed on the housing, and the fan is fixed on the housing via the hooks. Although this way does not require screws for assembly and disassembly, the fixation strength between the hooks and the frame of the fan is not easy to control. If there is a gap between the hooks and the frame of the fan, it will make noise when the fan operates. Moreover, if the hooks are tightly fixed with the frame of the fan, the hooks are easy to be broken during the disassembling process.

Thus, providing a heat dissipation module and a fastening structure thereof, which can be assembled and disassembled rapidly by eliminate the use of hand tools and can reduce noise making, is desired.

BRIEF SUMMARY OF THE INVENTION

The present invention provides a heat dissipation module and a fastening structure thereof, which eliminates the use of hand tools and noise making, and can be assembled and disassembled rapidly.

In order to achieve the above-mentioned, the present invention provides a fastening structure applied to a fan, the fastening structure including a housing and at least one fixing element. The housing includes at least one sidewall. The fixing element is disposed on the sidewall and the fixing element includes a first protruding part protruding from the inner side of the sidewall. When the fan is assembled with the fastening structure, the first protruding part partially enters into at least one molding hole of a frame of the fan and the first protruding part is placed against the edge of the molding hole.

In order to achieve the above-mentioned, the present invention also provides a heat dissipation module including a fan and a fastening structure. The fastening structure includes a housing and at least one fixing element. The housing includes at least one sidewall. The fixing element is disposed on the sidewall and the fixing element includes a first protruding part protruding from the inner side of the sidewall. When the fan is assembled with the fastening structure, the first protruding part partially enters into at least one molding hole of a frame of the fan and the first protruding part is placed against the edge of the molding hole.

As the above-mentioned heat dissipation module of the present invention and fastening structure thereof, the first protruding part includes an inclined surface. The inclined surface is not higher than the edge of the molding hole. The inclined surface is connected to the edge of the molding hole along a line. And the fixing element further includes a second protruding part protruding from the outer side of the sidewall and the second protruding part includes a guiding surface.

Further, the housing includes a movable handle placed against the second protruding part. The heat dissipation module and the fastening structure thereof further include at least one groove on the outer side of the sidewall, wherein the movable handle is accommodated in the groove. When the movable handle props up the guiding surface of the second protruding part, a force is exerted to the fixing element and makes the first protruding part partially enters into the molding hole. The housing and the fixing element are integrally formed as a monolithic unit. The fixing element is made of a high polymer material, such as polyester plastics. And the fixing element is flexible. The fan further includes a frame with a plurality of fixing holes. And the housing further includes a plurality of protrusions. The protrusions have hollow-cylinder shapes and correspond to the fixing holes.

The heat source may be a central processing unit, a transistor, a server, a high level graphic card, a hard disc, a power supply, a traffic control system, a multimedia electronic device, a mobile communication station or a high level game machine. The fastening structure further includes an elastic sheet for connecting the fastening structure to a heat sink. Otherwise the fastening structure and the heat sink are connected by a plurality of screws. The housing is rectangular, square, circular or other shaped. The fan is an axial fan.

The present invention can be more fully understood by reading the subsequent detailed description and examples with references made to the accompanying drawings, wherein:

DETAILED DESCRIPTION OF THE INVENTION

Figure 1:
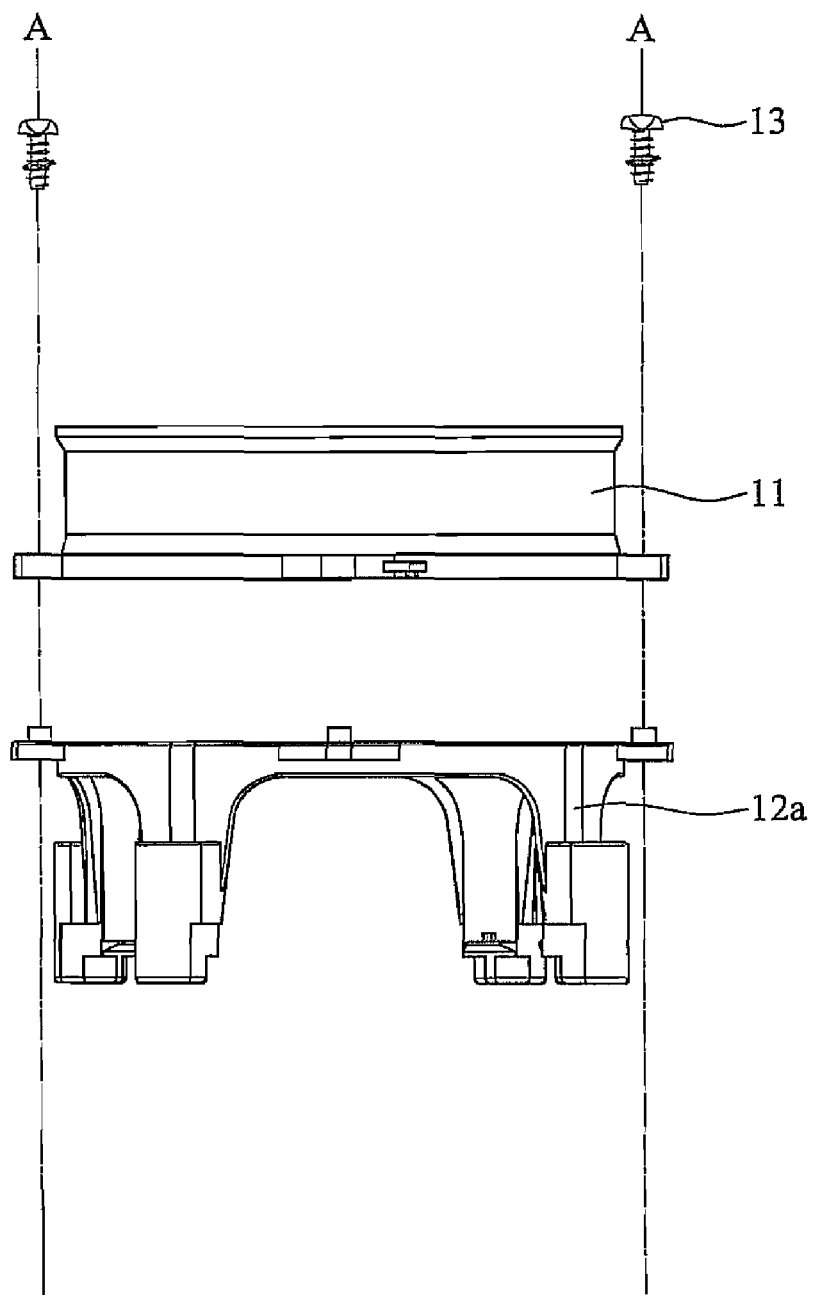
FIG. 1 is an exploded view of a conventional fan and housing.
Figure 2:
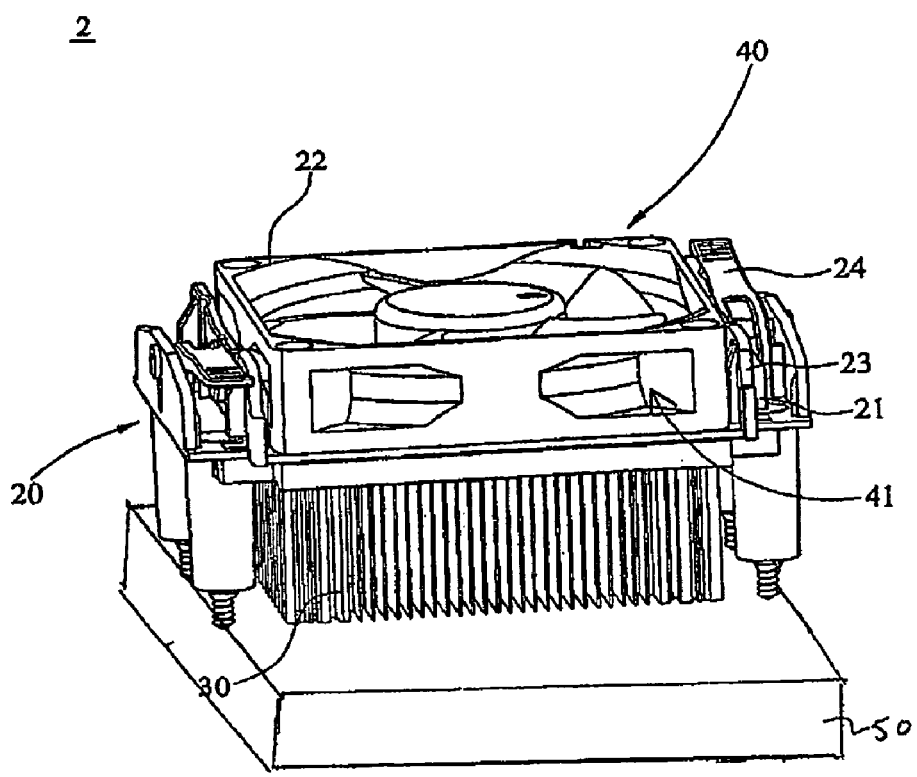
FIG. 2 is a schematic view of an assembled heat dissipation module of the present invention.
Figure 3A:
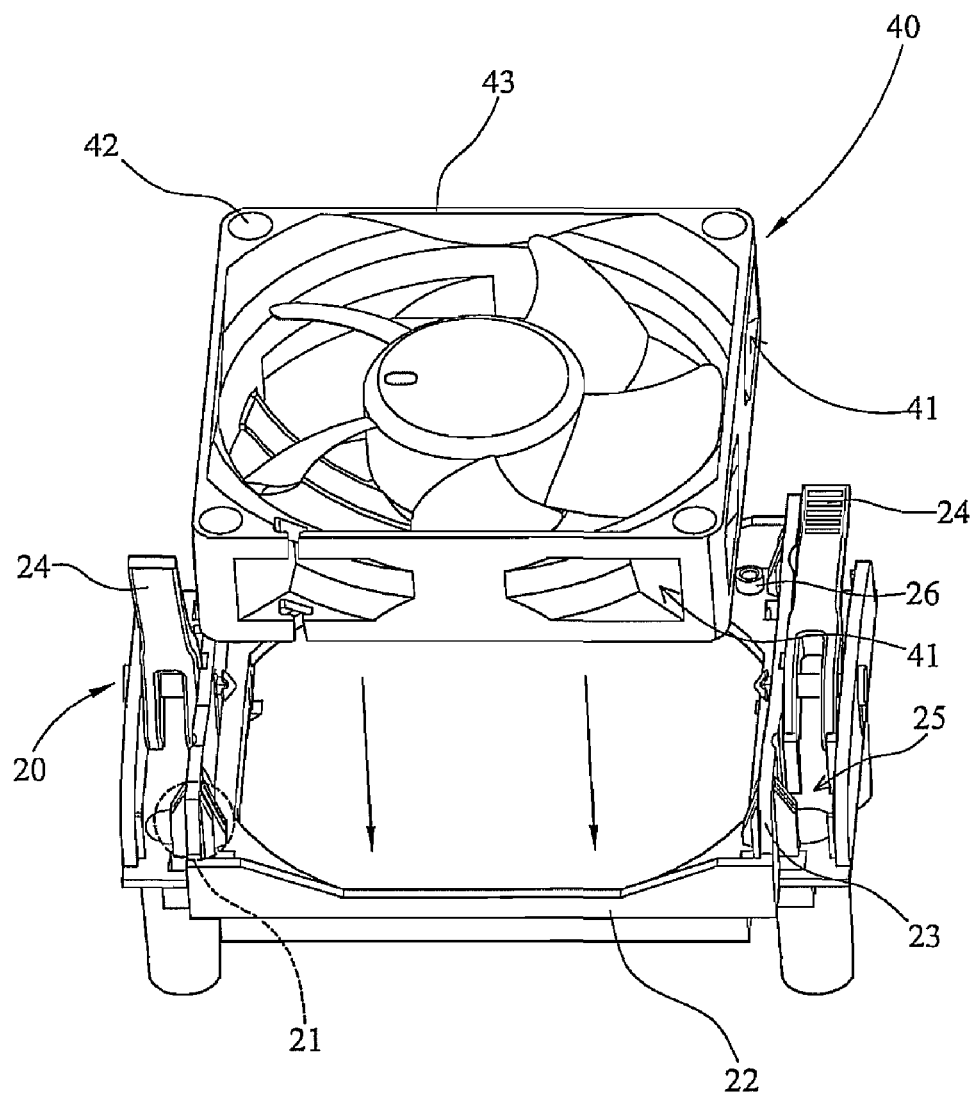
FIG. 3A is a schematic view of the fastening structure and the fan in FIG. 2.

Referring to FIG. 2, FIG. 2 is a schematic view of a fixed heat dissipation module of the present invention. The heat dissipation module 2 includes a fan 40, a fastening structure 20 and a heat sink 30. The fastening structure 20 includes a housing 22 and at least one fixing element 21. The housing 22 includes at least one sidewall 23. The fixing element 21 is disposed on the sidewall 23 of the housing 22 and protrudes from the inner side of the sidewall 23. The heat dissipation module 2 is applied to a heat source for dissipating heats generated by the heat source 50. The heat source 50 may be a central processing unit, a transistor, a server, a high level graphic card, a hard disc, a power supply, a traffic control system, a multimedia electronic device, a mobile communication station or a high level game machine Referring to FIG. 3A, FIG. 3A is a schematic view of the fastening structure and the fan in FIG. 2. The shape of the housing 22 of the fastening structure 20 is not limited and may be rectangular, square, circular or other shaped. The housing 22 includes a movable handle 24 and a groove 25. The groove 25 is disposed on the outer side of the sidewall 23 for containing the movable handle 24. Considering the convenience of putting in use that after fixing the fastening structure 20 and the housing 43 of the fan 40, a plurality of protrusions 26 with hollow cylindrical shapes are further disposed on the housing 22 and correspond to the fixing holes 42 of the frame 43 for assemble the fan 40 and the fastening structure 20 with the outside element via screws easily.

Figure 3B:
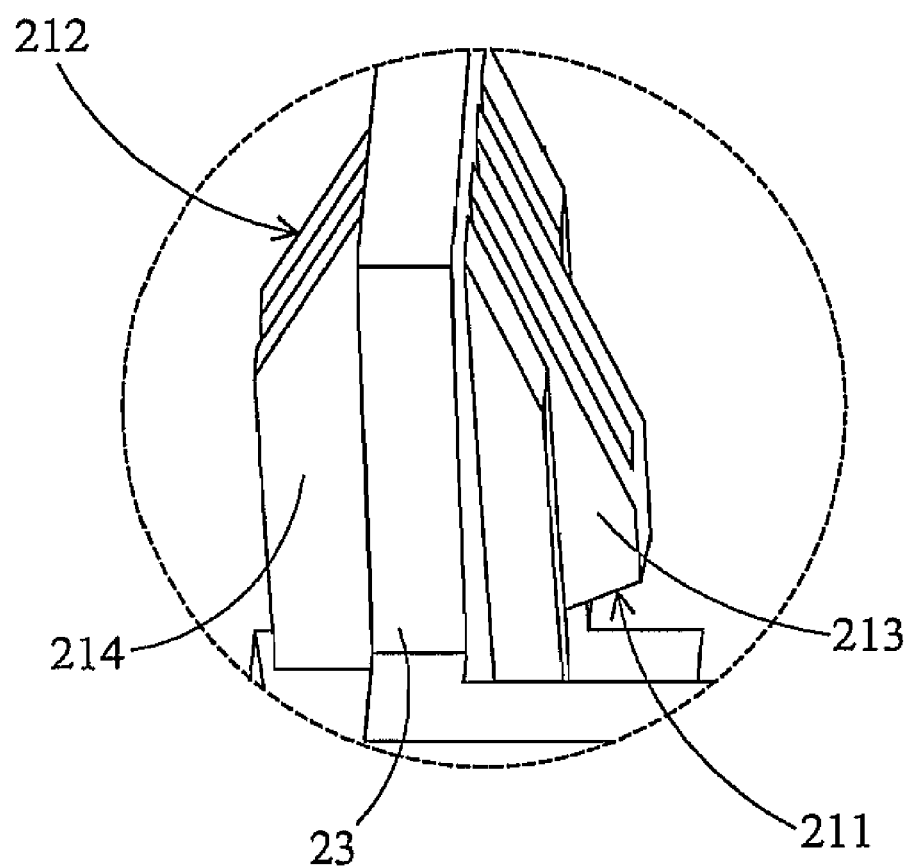
FIG. 3B is a partial enlarged view of the fixing element in FIG. 3A.

Referring to FIGS. 3A and 3B, FIG. 3B is a partial enlarged view of a fixing element in FIG. 3A. The fixing element 21 and the housing 22 are integrally formed as a monolithic unit. The fixing element 21 and the housing 22 are made of a high polymer material, such as polyester plastics. The fixing element 21 includes a first protruding part 213 and a second protruding part 214. The first protruding part 213 protrudes from the inner side of the sidewall 23 of the housing 22 and has an inclined surface 211. The second protruding part 214 protrudes from the outer side of the sidewall 23 and has a guiding surface 212.

Figure 3C:
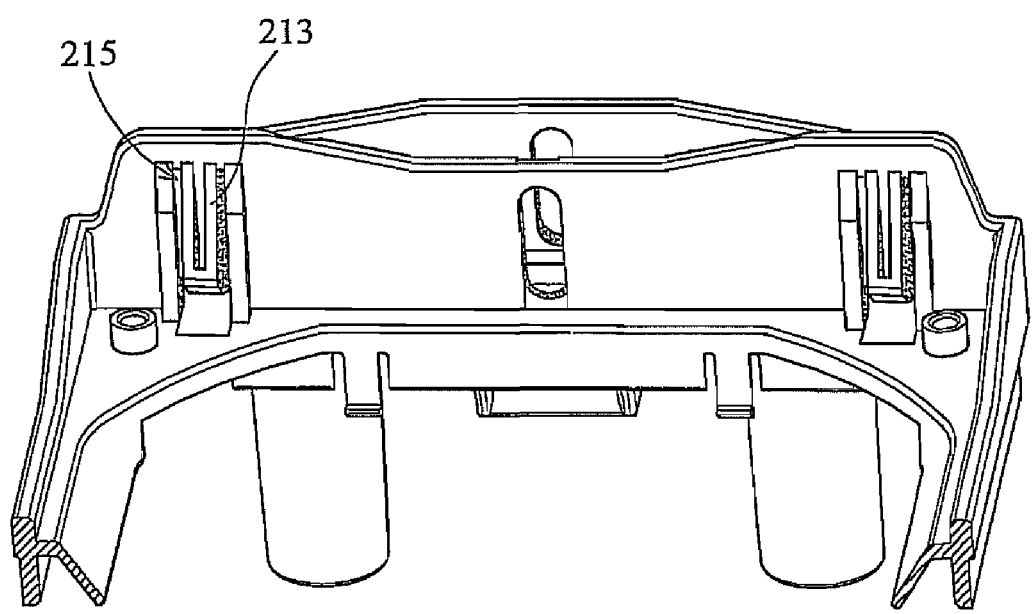
FIG. 3C is a schematic view of the fixing element in FIG. 3A.

Referring to FIGS. 3A and 3C, FIG. 3C is another schematic view of a fixing element in FIG. 3A. Two sides of the fixing element 21 respectively have an opening 215, thus, the fixing element 21 is flexible. When the movable handle 24 of the housing 22 is pulled downward, the movable handle 24 props up the guiding surface 212 of the second protruding part 214 for guiding the first protruding part 213 of the fixing element 21 to move toward the fan 40.

The process of fixing the fan and the fastening structure is described in detail as below. Referring to FIG. 3A, when the fan, such as an axial fan, is assembled with the fastening structure 20, the fixing hole 42 of the frame 43 corresponds to the protrusion 26 of the fastening structure 20. Because the diameter of the protrusion 26 is slightly less than that of the fixing hole 42, the protrusion 26 can limit lateral movement of the fan 40 while the protrusion 26 passes through the fixing hole 42.

Figure 4A:
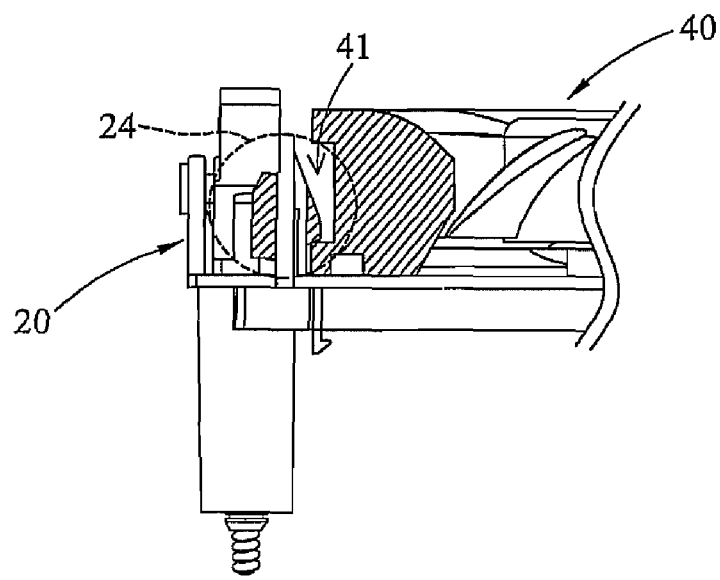
FIG. 4A is a schematic view showing a fixing element that is not connected to a movable handle.
Figure 4B:
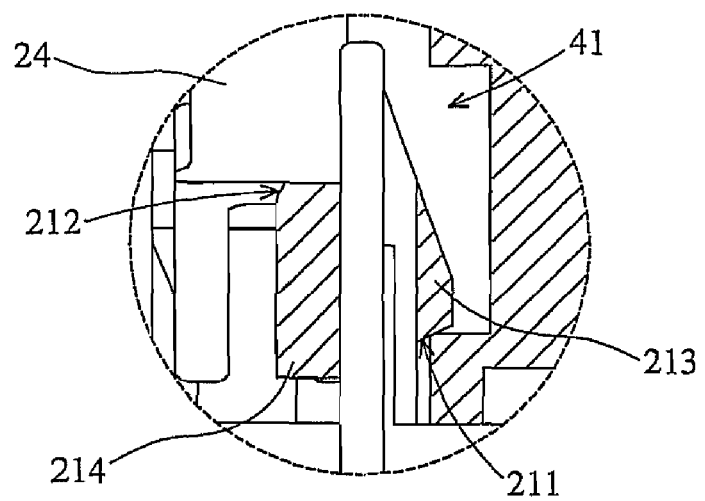
FIG. 4B is a partial enlarged view of FIG. 4A.
Figure 4C:
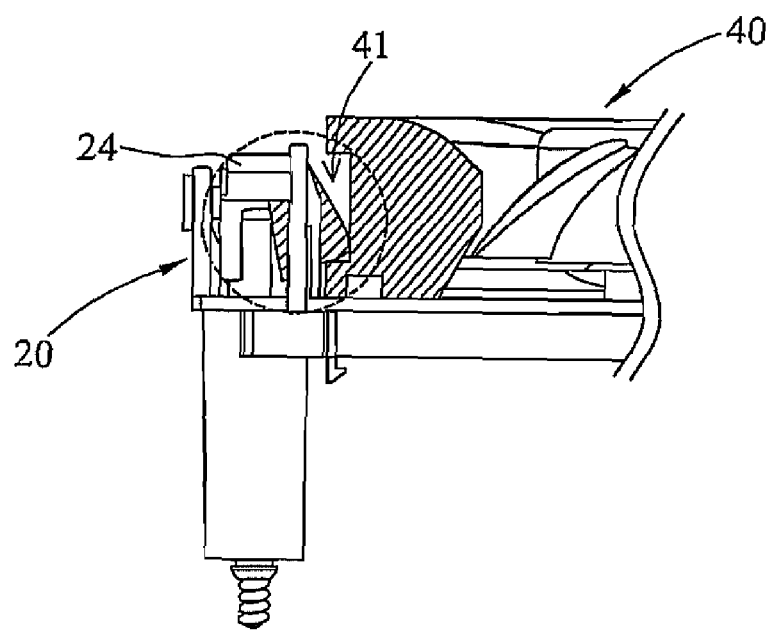
FIG. 4C is a schematic view showing a fixing element connected to a movable handle.
Figure 4D:
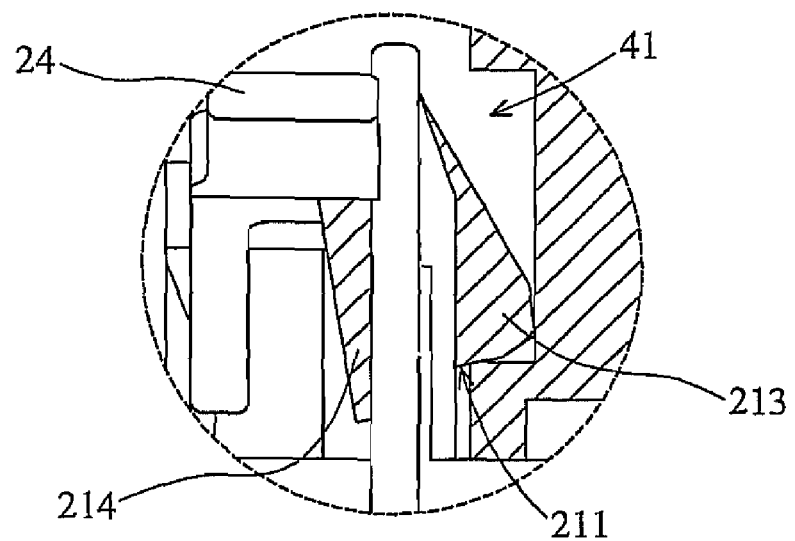
FIG. 4D is a partial enlarged view of FIG. 4C.

Referring to FIGS. 4A, 4B, 4C and 4D, FIG. 4A is a schematic view showing a fixing element that is not connected to a movable handle. FIG. 4B is a partial enlarged view of FIG. 4A. FIG. 4C is a schematic view showing a fixing element connected to a movable handle. FIG. 4D is a partial enlarged view of FIG. 4C. When the fan 40 is disposed corresponding to the fastening structure 20, the edge of the molding hole 41 of the frame 43 is placed against the inclined surface 211 of the first protruding part 213 of the fixing element 21, as shown in FIGS. 4A and 4B. Then, the movable handle 24 of the housing 22 is pulled downward and is placed against the guiding surface 212 of the second protruding part 214 for providing a force to the fixing element 21. Also, because of the fixing element 21 is flexible, the first protruding part 213 of the fixing element 21 partially enters into the molding hole 41 of the fan 40 along the inclined surface 211.

For the utility of the fixing element 21, the inclined surface 211 of the first protruding part 213 is designed to be not higher than the edge of the molding hole 41. Thus, the inclined surface 211 is connected to the edge of the molding hole 41 thereof along a line. The force mentioned above is transmitted to the fan 40 via the edges of the inclined surface 211 and the molding hole 41, so as to limit movement of the fan 40, as shown in FIGS. 4C and 4D. If a broken fan 40 needs to be replaced and be disassembled, it is easy to disassemble the fan 40 by pulling up the movable handle 24 and providing a force to the fixing element 21. The present invention not only avoids the disadvantage of the conventional art which requires use of screws and hand tools, but also provides rapid assembly and decreases time-consuming of manual labor. Finally, the fastening structure is fixed with the heat sink. Thus, advantage of the heat dissipation module is completely shown.

Figure 5A:
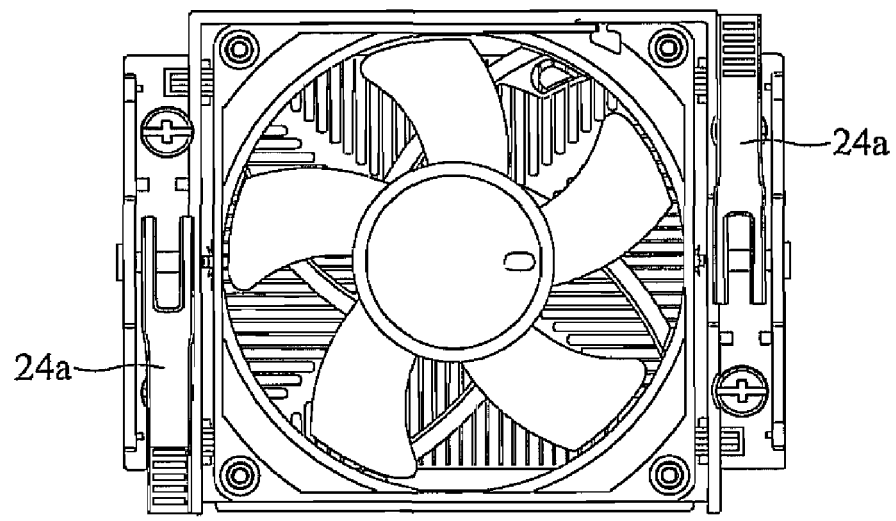
FIGS. 5A and 5B are schematic views of two embodiments of the movable handle of the present invention.
Figure 5B:
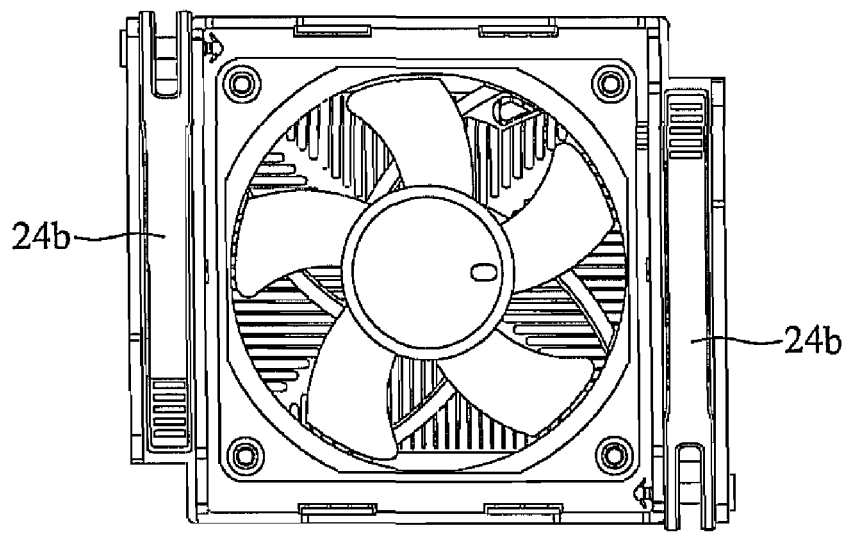

However, the present invention is not limited to the above-mentioned embodiments. Referring to FIGS. 5A and 5B, FIGS. 5A and 5B are schematic views of two embodiments of the movable handle of the present invention. FIG. 5A shows a fan with a square frame, and the axles of the two movable handles 24a are installed in the center of two sides of the sidewall. FIG. 5B shows a fan with a square frame, and the axles of the two movable handles 24b are installed in two corners of the sidewall. When the axles of the two movable handles 24a are installed in the center of two sides of the sidewall, the movable handles 24a are rotatable to two sides of the two axles respectively. If a fixing element is broken, the movable handle 24a can be rotated to the unbroken side and is still available for operation, as shown in FIG. 5A. When the two movable handles 24b are installed in two corners of the sidewall, the movable handles 24b can fix many fixing elements simultaneously and enhances fixation effectiveness of the fixing elements, as shown in FIG. 5B.

Figure 6A:
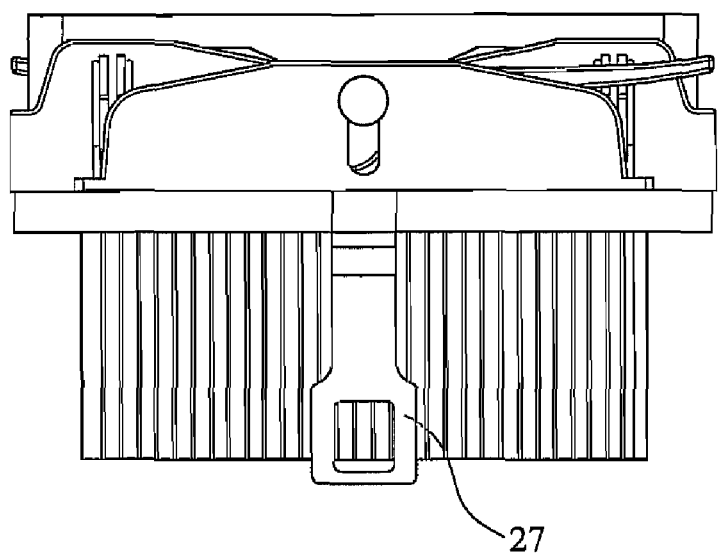
FIGS. 6A to 6C are schematic views of three embodiments of the heat dissipation module of the present invention.
Figure 6B:
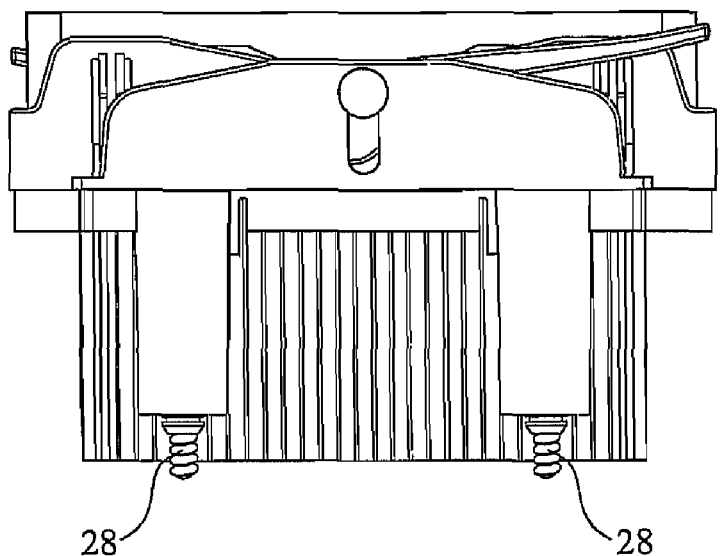
Figure 6C:
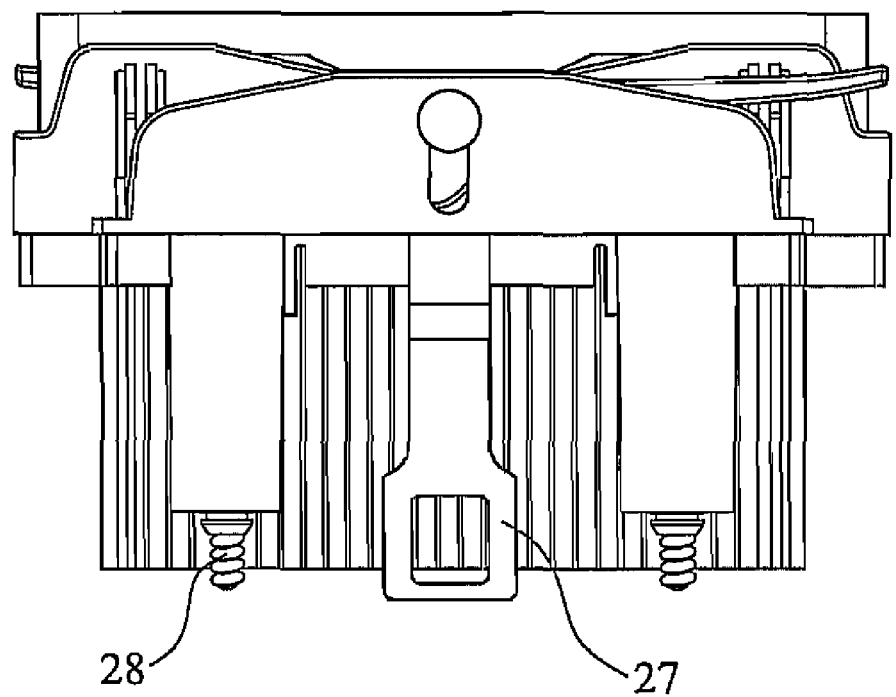

Referring to FIGS. 6A to 6C, FIGS. 6A to 6C are schematic views of three embodiments of the heat dissipation module of the present invention. In FIG. 6A, the fastening structure is assembled with the heat sink via two elastic sheets 27 protruding from two sides of the fastening structure. In FIG. 6B, the fastening structure is assembled with the heat sink via a plurality of screws 28. In FIG. 6C, the fastening structure is assembled with the heat sink via two elastic sheets 27 and a plurality of screws 28. No matter what kind of the above-mentioned fixation, advantage of the present invention is fully shown.

Note that the amount of the fixing element is decided according to actual product requirements. Thus, when applied to a fan with high rotational speed, a large number of the fixing elements and the movable handles are installed at all sidewalls correspond to the molding holes of the fan. The large number of fixing elements provides a tight fixation so that noise is eliminated.

In sum, the heat dissipation module and the fastening structure thereof of the present invention provides vertical movement limitation of the fan via the fixing element propped against the edge of the molding hole, and avoids use of hand tools for assembly, and further avoids noise and structural damage resulting from improper fixation.

While the present invention has been described by way of example and in terms of the preferred embodiments, it is to be understood that the present invention is not limited to the disclosed embodiments. To the contrary, it is intended to cover various modifications and similar arrangements (as would be apparent to those skilled in the art). Therefore, the scope of the appended claims should be accorded with the broadest interpretation so as to encompass all such modifications and similar arrangements.

What is claimed is:

1. A fastening structure applied to a fan, the fastening structure comprising:
    a housing comprising at least one sidewall; and
    at least one fixing element disposed on the sidewall and the fixing element comprising a first protruding part protruding from the inner side of the sidewall,
    wherein when the fan is assembled with the fastening structure, the first protruding part partially enters into at least one molding hole of a frame of the fan and the first protruding part is placed against an edge of the molding hole, and
    wherein the first protruding part comprises an inclined surface not higher than the edge of the molding hole, and the edge of the inclined surface is connected to the edge of the molding hole along a line.

2. The fastening structure as claimed in claim 1, wherein the fixing element further comprises a second protruding part protruding from the outer side of the sidewall, and the second protruding part comprises a guiding surface.

3. The fastening structure claimed in claim 2, wherein the housing comprises a movable handle placed against the guiding surface of the second protruding part and the movable handle provides a force to the fixing element.

4. The fastening structure claimed in claim 2, further comprising at least one groove on the outer side of the sidewall, and the housing comprises a movable handle accommodated in the groove.

5. The fastening structure claimed in claim 1, wherein the housing and the fixing element are integrally formed as a monolithic unit, and the fixing element is flexible.

6. The fastening structure claimed in claim 1, wherein the fixing element comprises a high polymer material, such as polyester plastics.

7. The fastening structure claimed in claim 1, wherein a frame of the fan comprises a plurality of fixing holes, and the housing further comprises a plurality of protrusions corresponding to the fixing holes, and the protrusions have hollow-cylinder shapes.

8. The fastening structure claimed in claim 1, wherein the housing is rectangular, square; or circular shaped, and the fan is an axial fan.

9. A heat dissipation module, comprising:
    a fan; and
    a fastening structure comprising:
        a housing comprising at least one sidewall; and
        at least one fixing element disposed on the sidewall of the housing, and the fixing element comprising a first protruding part protruding from the inner side of the sidewall,
    wherein when the fan is assembled with the fastening structure, the first protruding part partially enters into at least one molding hole of a frame of the fan and the first protruding part is placed against an edge of the molding hole, and,
    wherein the first protruding part comprises an inclined surface not higher than the edge of the molding hole, and the edge of the inclined surface is connected to the edge of the molding hole along a line.

10. The heat dissipation module as claimed in claim 9, wherein the fixing element further comprises a second protruding part protruding from the outer side of the sidewall, and the second protruding part comprises a guiding surface.

11. The heat dissipation module claimed in claim 10, wherein the housing comprises a movable handle placed against the guiding surface of the second protruding part and the movable handle provides a force to the fixing element.

12. The heat dissipation module claimed in claim 10, further comprising at least one groove on the outer side of the sidewall, and the housing comprises a movable handle accommodated in the groove.

13. The heat dissipation module claimed in claim 9, wherein the housing and the fixing element are integrally formed as a monolithic unit, and the fixing element is flexible.

14. The heat dissipation module claimed in claim 9, wherein the frame of the fan comprises a plurality of fixing holes, and the housing further comprises a plurality of protrusions corresponding to the fixing holes, and the protrusions have hollow-cylinder shapes.

15. The heat dissipation module claimed in claim 9, further comprising a heat sink to dissipate heats generated by a heat source, such as a central processing unit, a transistor, a server, a high level graphic card, a hard disc, a power supply, a traffic control system, a multimedia electronic device, a mobile communication station or a high level game machine.

16. The heat dissipation module claimed in claim 15, wherein the fastening structure further comprising an elastic sheet or a plurality of screws for connecting the fastening structure to the heat sink.

* * * * *